(12) United States Patent
Qiao et al.

(10) Patent No.: US 10,827,102 B2
(45) Date of Patent: Nov. 3, 2020

(54) IMAGE PROCESSING APPARATUS

(71) Applicant: Huawei Technologies Co., Ltd., Shenzhen (CN)

(72) Inventors: Fei Qiao, Beijing (CN); Kaige Jia, Beijing (CN); Zheyu Liu, Beijing (CN); Qi Wei, Beijing (CN); Hai Chen, Shenzhen (CN)

(73) Assignee: HUAWEI TECHNOLOGIES CO., LTD, Shenzhen (CN)

( * ) Notice: Subject to any disclaimer, the term of this patent is extended or adjusted under 35 U.S.C. 154(b) by 0 days.

(21) Appl. No.: 16/529,116

(22) Filed: Aug. 1, 2019

(65) Prior Publication Data
US 2019/0356821 A1 Nov. 21, 2019

Related U.S. Application Data

(63) Continuation of application No. PCT/CN2017/106574, filed on Oct. 17, 2017.

(30) Foreign Application Priority Data

Feb. 24, 2017 (CN) .......................... 2017 1 0105815

(51) Int. Cl.
*H04N 3/14* (2006.01)
*G05F 3/26* (2006.01)
*H01L 29/51* (2006.01)

(52) U.S. Cl.
CPC ........... *H04N 3/1581* (2013.01); *G05F 3/262* (2013.01); *H01L 29/517* (2013.01); *H04N 3/1512* (2013.01)

(58) Field of Classification Search
CPC ...... H04N 3/1581; H04N 3/1512; H04N 5/14; G05F 3/262; H01L 29/517; G06N 3/04; G06N 3/08; G06T 1/20
(Continued)

(56) References Cited

U.S. PATENT DOCUMENTS 5,537,512 A   7/1996   Hsia et al.
5,717,833 A   2/1998   Neely
(Continued)

FOREIGN PATENT DOCUMENTS

CN   1908578 A   2/2007
CN   1916959 A   2/2007
(Continued)

OTHER PUBLICATIONS

Foreign Communication From a Counterpart Application, Chinese Application No. 201710105815.X, dated Dec. 12, 2019, 4 pages.
(Continued)

*Primary Examiner* — Tammy Paige Goddard
*Assistant Examiner* — Darryl V Dottin
(74) *Attorney, Agent, or Firm* — Conley Rose, P.C.

(57) ABSTRACT

An image processing apparatus, which includes a first physical computing circuit, configured to receive a plurality of first analog signals output by an image sensor, and perform a convolution operation on the plurality of first analog signals to obtain a second analog signal. The plurality of first analog signals are in a one-to-one correspondence with a plurality of pieces of pixel data of a to-be-recognized image. The first physical computing circuit comprises at least one multiplication circuit array and at least one subtraction circuit, the at least one multiplication circuit array is in a one-to-one correspondence with the at least one subtraction circuit, a multiplication circuit in each multiplication circuit array comprises a differential pair transistor, each multiplication circuit array implements the convolution operation on the plurality of first analog signals using a plurality of multiplication circuits and a corresponding subtraction circuit.

20 Claims, 7 Drawing Sheets

(58) Field of Classification Search
USPC .......................................................... 358/483
See application file for complete search history.

(56) References Cited

U.S. PATENT DOCUMENTS

2007/0033244 A1 2/2007 Cohen et al.
2015/0309961 A1 10/2015 Ozaki et al.

FOREIGN PATENT DOCUMENTS

| CN | 1987928 A | 6/2007 |
|---|---|---|
| CN | 102646262 A | 8/2012 |
| CN | 105825484 A | 8/2016 |
| CN | 105976024 A | 9/2016 |
| CN | 105979174 A | 9/2016 |
| JP | H06187472 A | 7/1994 |

OTHER PUBLICATIONS

Machine Translation and Abstract of Chinese Publication No. CN1908578, Feb. 7, 2007, 19 pages.
Machine Translation and Abstract of Chinese Publication No. CN1916959, Feb. 21, 2007, 7 pages.
Machine Translation and Abstract of Chinese Publication No. CN1987928, Jun. 27, 2007, 11 pages.
Machine Translation and Abstract of Chinese Publication No. CN102646262, Aug. 22, 2012, 12 pages.
Machine Translation and Abstract of Chinese Publication No. CN105825484, Aug. 3, 2016, 8 pages.
Machine Translation and Abstract of Chinese Publication No. CN105976024, Sep. 28, 2016, 21 pages.
Machine Translation and Abstract of Chinese Publication No. CN105979174, Sep. 28, 2016, 16 pages.
Machine Translation and Abstract of Japanese Publication No. JPH06187472, Jul. 8, 1994, 13 pages.
Lu, J., et al, "A 1 TOPS/W Analog Deep Machine-Learning Engine With Floating-Gate Storage in 0.13 μm CMOS," IEEE Journal of Solid-State Circuits, vol. 50, No. 1, Jan. 2015, pp. 270-281.
Hinton, G., et al, "A fast learning algorithm for deep belief nets," Neural Computation, 2006, 16 pages.
Boden, M., "A guide to recurrent neural networks and backpropagation," Dallas Project Sics Technical Report T Sics, Nov. 13, 2001, 10 pages.
Guo, K., et al, "Angel-Eye: A Complete Design Flow for Mapping CNN onto Customized Hardware," IEEE Computer Society Annual Symposium on VLSI (ISVLSI), Sep. 8, 2016, pp. 24-29.
Garcia, C., et al, "Convolutional Face Finder: A Neural Architecture for Fast and Robust Face Detection," IEEE Transactions on Pattern Analysis and Machine Intelligence, vol. 26, No. 11, Nov. 2004, pp. 1408-1423.
Chen, Y., et al, "DaDianNao: A Machine-Learning Supercomputer," 47th Annual IEEE/ACM International Symposium on Microarchitecture, Jan. 19, 2015, pp. 609-622.
Garcia, C., et al, "Text Detection with Convolutional Neural Networks," In VISAPP 2008: Proceedings of the Third International Conference on Computer Vision Theory and Applications, 2008, 6 pages.
Chen, T., et al, "DianNao: A Small-Footprint High-Throughput Accelerator for Ubiquitous Machine-Learning," ASPLOS, Mar. 1-5, 2014, 15 pages.
Lecun Y., et al, "Gradient-Based Learning Applied to Document Recognition," Proceedings of the IEEE, vol. 86, No. 11, 1998, 46 pages.
Farabet, C., et al, "NeuFlow: A Runtime Reconfigurable Dataflow Processor for Vision," CVPR Workshops, Aug. 12, 2011, pp. 109-116.
Phan, P., et al, "NeuFlow: Dataflow Vision Processing System-on-a-Chip," IEEE 55th International Midwest Symposium on Circuits and Systems (MWSCAS), Sep. 5, 2012, pp. 1044-1047.
Likamwa, R., et al, "RedEye: Analog ConvNet Image Sensor Architecture for Continuous Mobile Vision," ACM/IEEE 43rd Annual International Symposium on Computer Architecture (ISCA), Aug. 25, 2016, pp. 255-266.
Du, Z., et al, "ShiDianNao: Shifting Vision Processing Closer to the Sensor," ISCA'15, Jun. 13-17, 2015, pp. 92-104.
Foreign Communications From a Counterpart Application, Chinese Application No. 201710105815.X, Chinese Office Action dated Jul. 25, 2019, 5 pages.
Foreign Communication From a Counterpart Application, PCT Application No. PCT/CN2017/106574 English Translation of International Search Report dated Dec. 28, 2017, 2 pages.
Foreign Communication From a Counterpart Application, PCT Application No. PCT/CN2017/106574, English Translation of Written Opinion dated Dec. 28, 2017, 4 pages.

IMAGE PROCESSING APPARATUS

CROSS-REFERENCE TO RELATED APPLICATIONS

This application is a continuation of International Application No. PCT/CN2017/106574, filed on Oct. 17, 2017, which claims priority to Chinese Patent Application No. 201710105815.X, filed on Feb. 24, 2017. The disclosures of the aforementioned applications are hereby incorporated by reference in their entireties.

TECHNICAL FIELD

This application relates to the field of image processing, and more specifically, to an image processing apparatus.

BACKGROUND

With development of artificial intelligence, machine learning (ML) related algorithms and theories are widely applied to various fields and achieve remarkable effects. In massive machine learning algorithms, a neural network algorithm processes original information through simulation of behavior features of a biological neural system, extracts multidimensional features, and is widely concerned in a pattern recognition field. Since a feedforward neural network perceptron was proposed in 1957, and after development of more than half a century, many algorithms of different structures have been derived from the neural network algorithm in different fields. For example, a deep neural network (DNN) algorithm, a recurrent neural network (RNN) algorithm, and a convolutional neural network (CNN) algorithm play more important roles in different fields.

Due to a more approximate algorithm structure to a network structure of a biological visual system, a unique convolution operation, and a desirable classification effect, a convolutional neural network algorithm has gradually developed into a focus concerned in an image recognition field. Different scholars develop CNN network models of different structures such as LeNet-5 used for hand-written character recognition, Color and Frequency Features (CFF) used for facial recognition, and ConvNN used for text recognition in different image recognition fields. According to the CNN network models, precision of picture classification is improved to a level that a conventional algorithm cannot reach.

As a deep learning training method is continuously optimized and improved, the CNN has a larger network depth and a more complex network structure, so that accuracy of the CNN in various picture classification tasks becomes higher. However, as recognition accuracy of the CNN continuously increases, an operation cost of the CNN also continuously increases accordingly. A conventional operation platform already cannot satisfy requirements of the convolutional neural network on an operation speed and power consumption.

SUMMARY

This application provides an image processing apparatus, to accelerate a convolutional neural network algorithm in an analog domain and satisfy requirements of a convolutional neural network on an operation speed and power consumption.

According to a first aspect, this application provides an image processing apparatus. The apparatus includes a first physical computing circuit, configured to receive a plurality of first analog signals output by an image sensor, and perform a convolution operation on the plurality of first analog signals to obtain a second analog signal, where the plurality of first analog signals are in a one-to-one correspondence with a plurality of pieces of pixel data of a to-be-recognized image, the first physical computing circuit comprises at least one multiplication circuit array and at least one subtraction circuit, the at least one multiplication circuit array is in a one-to-one correspondence with the at least one subtraction circuit, each multiplication circuit array includes a plurality of multiplication circuits, each multiplication circuit comprises a differential pair transistor, each multiplication circuit array implements the convolution operation on the plurality of first analog signals using the plurality of multiplication circuits and a corresponding subtraction circuit, a differential input voltage of a plurality of differential pair transistors included in each multiplication circuit array is used as a convolution kernel used by the multiplication circuit array to perform the convolution operation, and each of the at least one multiplication circuit array has a different convolution kernel, and a recognition unit, configured to recognize the second analog signal to obtain information about a recognition result of the to-be-recognized image.

In a possible implementation, each differential pair transistor includes a first metal-oxide semiconductor (MOS) transistor and a second MOS transistor, and the first MOS transistor and the second MOS transistor work in a sub-threshold region.

In a possible implementation, the subtraction circuit includes two input interfaces and one output interface, a drain of the first MOS transistor included in each differential pair transistor is used as a first output interface of the corresponding multiplication circuit, a drain of the second MOS transistor included in each differential pair transistor is used as a second output interface of the corresponding multiplication circuit, first output interfaces of all the multiplication circuits in the multiplication circuit array are connected to one input interface of the subtraction circuit, and second output interfaces of all the multiplication circuits in the multiplication unit array are connected to the other input interface of the subtraction circuit, and the subtraction circuit includes two P-channel current mirrors (PMIRs) and one N-channel current mirror (NMIR), one input interface of the subtraction circuit is connected to the output interface of the subtraction circuit through one of the two PMIRs, and the other input interface of the subtraction circuit is connected to the output interface of the subtraction circuit through the other one of the two PMIRs and the NMIR.

In a possible implementation, the apparatus further includes a second physical computing circuit, configured to perform a pooling operation on the second analog signal to obtain a third analog signal. The second physical computing circuit comprises a current mirror circuit.

In a possible implementation, there are a plurality of second analog signals, and the second physical computing circuit comprises at least one current mirror circuit, the at least one current mirror circuit is in a one-to-one correspondence with the at least one multiplication circuit array, and each current mirror circuit is configured to perform a pooling operation on a second analog signal that is output by a corresponding multiplication circuit array.

In a possible implementation, the apparatus further includes a third physical computing circuit, where an input interface of the third physical computing circuit is connected to an output interface of the first physical computing circuit, to perform non-linear mapping processing on the second analog signal to obtain a fourth analog signal, and a fourth physical computing circuit, where an input interface of the fourth physical computing circuit is connected to an output interface of the third physical computing circuit, to perform a pooling operation on the fourth analog signal. The fourth physical computing circuit comprises a current mirror circuit.

In a possible implementation, the third physical computing circuit comprises a circuit including a third MOS transistor and a fourth MOS transistor, and the third MOS transistor and the fourth MOS transistor work in the subthreshold region.

In a possible implementation, the apparatus further includes a fifth physical computing circuit. An input interface of the fifth physical computing circuit is connected to an output interface of the second physical computing circuit, to perform non-linear mapping processing on the third analog signal.

In a possible implementation, the fifth physical computing circuit comprises a circuit including a fifth MOS transistor and a sixth MOS transistor, and the fifth MOS transistor and the sixth MOS transistor work in the subthreshold region.

In a possible implementation, the pooling operation is average pooling.

According to the image processing apparatus provided in the embodiments of this application, related processing such as the convolution operation and the pooling operation that are performed on an image in an analog domain is implemented using the physical computing circuits organized based on a structure of a convolutional neural network, so that requirements of the convolutional neural network on real-time quality and low power consumption are satisfied while a convolutional neural network algorithm is accelerated.

DESCRIPTION OF EMBODIMENTS

The following describes technical solutions of this application with reference to accompanying drawings.

A CNN is a deep learning architecture. A convolutional neural network algorithm has a more approximate structure to a network structure of a biological visual system, and therefore has gradually developed into a focus in an image recognition field since proposed in the 1960s. Particularly in a mode classification field, complex pre-processing of an image at a previous stage is avoided through the convolutional neural network, and an original image can be directly input. Therefore, the convolutional neural network is more widely applied.

As a deep learning training method is continuously optimized and improved, the CNN has a larger network depth and a more complex network structure, so that accuracy of the CNN in various picture classification tasks becomes higher. However, as recognition accuracy of the CNN continuously increases, an algorithm cost of the CNN also continuously increases accordingly, and a conventional central processing unit (CPU) platform already cannot satisfy requirements of the CNN on an operation speed and power consumption.

In view of this, embodiments of this application provide an image processing apparatus, to accelerate the convolutional neural network algorithm in an analog domain and satisfy the requirements of the convolutional neural network on the operation speed and the power consumption.

First, concepts related to the convolutional neural network in the embodiments of this application are briefly described.

The convolutional neural network usually includes a convolution layer, a pooling layer, and a full-connection layer.

Figure 1:
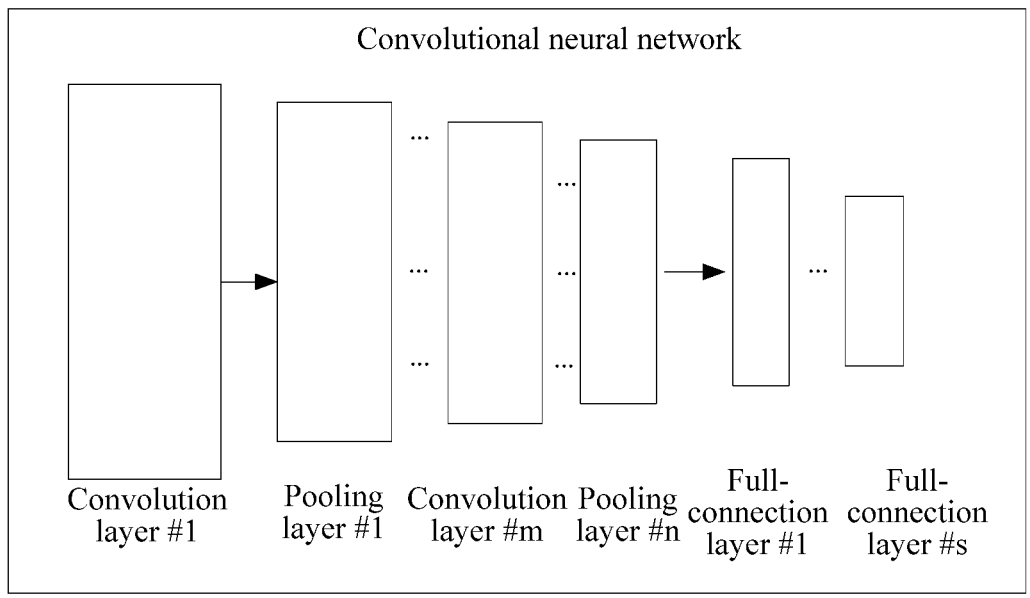
FIG. 1 is a basic architectural diagram of a convolutional neural network.

FIG. 1 is a diagram of a basic frame of a convolutional neural network. Referring to FIG. 1, the convolutional neural network includes convolution layers, pooling layers, and full-connection layers. A plurality of convolution layers and a plurality of pooling layers are alternately arranged. A convolution layer may be followed by a convolution layer or a pooling layer. The convolution layer is mainly used to perform a convolution operation on an input matrix including pixel data of a to-be-recognized image, to extract features of the to-be-recognized image. The pooling layer is usually used immediately after use of the convolution layer, and is mainly used to perform a pooling operation on an output matrix of a previous layer. A common processing manner includes maximum pooling and average pooling. The pooling layer may also be referred to as a sub-sampling layer, and samples the features extracted by the convolution layer. It may also be considered that the pooling layer simplifies the output matrix of the convolution layer. Several full-connection layers are connected in the last part of the convolutional neural network, and a classification result of the to-be-recognized image is finally output.

For ease of understanding, a process of performing a convolution operation by the convolutional neural network is briefly described below.

Figure 2:
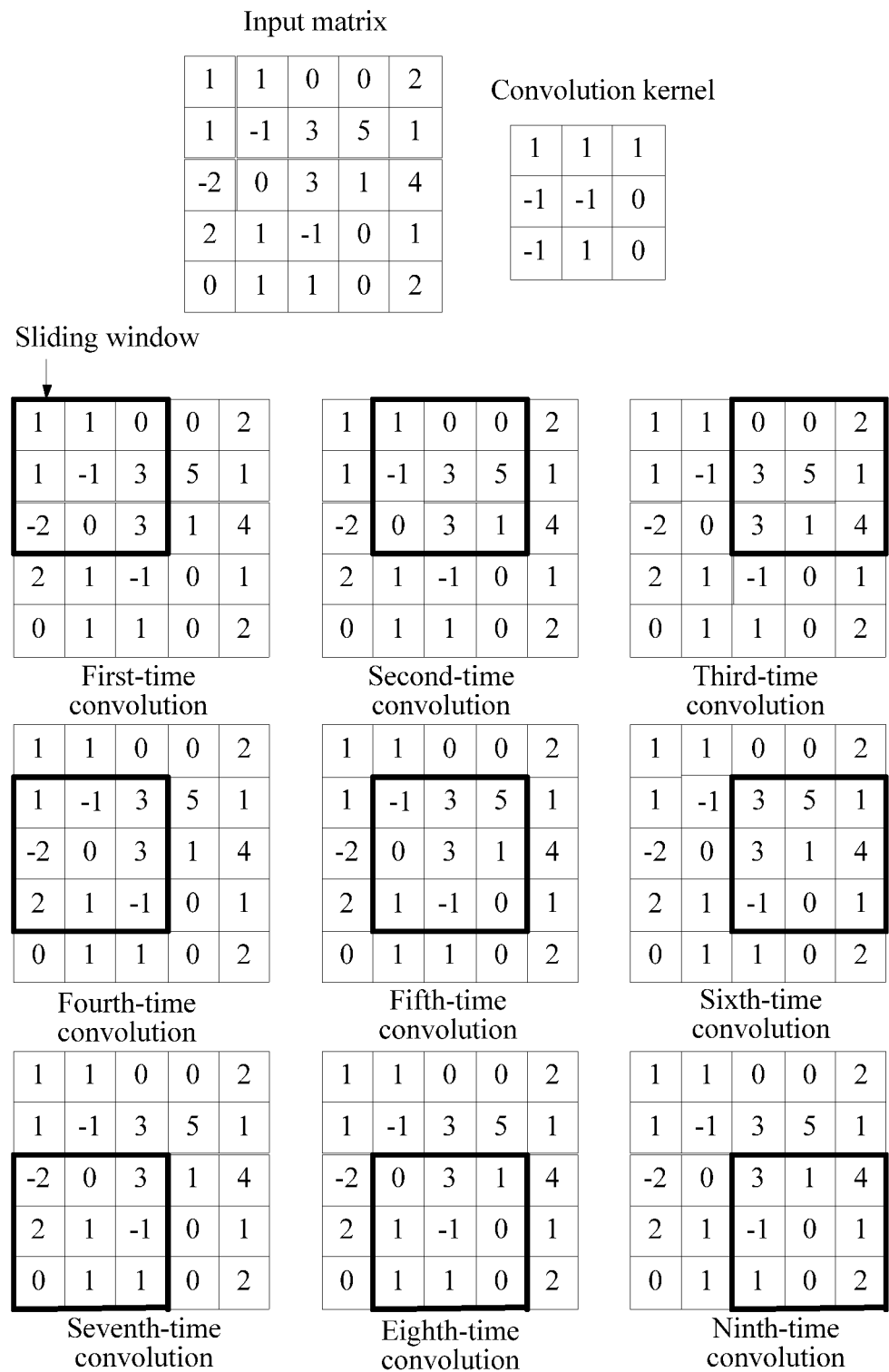
FIG. 2 is a schematic diagram of a convolution operation process.

FIG. 2 is a schematic diagram of a convolution operation process. Referring to FIG. 2, an example in which an input matrix is a 5×5 matrix (denoted as a matrix # A), a convolution kernel is a 3×3 matrix (denoted as a matrix # B), and a step (denoted as S) is 1 is used in FIG. 2. A size of a sliding window represents a size of the convolution kernel. During a convolution operation, the sliding window slides based on the step in left-to-right and up-to-bottom directions starting from a top-left location in the matrix # A. An output matrix can be obtained by performing the convolution operation for nine times in the manner shown in FIG. 2.

The pooling operation is used to reduce a dimension of the input matrix. According to the pooling operation, computing complexity can be lowered, and in addition, the features extracted by the convolution layer are sampled to extract a main feature of the to-be-recognized image. A type of the pooling operation mainly includes maximum pooling, average pooling, and the like. The average pooling is averaging all elements in the sliding window. The maximum pooling is calculating a maximum value of all the elements in the sliding window. A pooling process is approximately similar to the convolution process. A difference is that operation manners of data elements in the sliding window are different.

As described above, the convolutional neural network includes a plurality of layers, and each layer performs a corresponding operation on the obtained pixel data of the to-be-recognized image. For example, the convolution layer performs a convolution operation, and the pooling layer performs a pooling operation. In the embodiments of this application, analog operation units (namely, physical computing circuits) are arranged according to an algorithm procedure of the convolutional neural network with reference to a composition structure of the convolutional neural network, so that each analog operation unit can perform an operation or an operation of a corresponding neural network layer.

It should be noted that the physical computing circuits described in the embodiments of this application may be integrated together or may be separated from each other. This is not limited in the embodiments of this application.

An analog computing circuit in the embodiments of this application is implemented in a form of an analog circuit, and the analog circuit is constructed based on characteristics of electronic parts and components to implement an arithmetical operation of the characteristics.

It may be understood that, on the one hand, the analog circuit has a simple structure, small hardware consumption, low power consumption, and a high operation speed, and compared with an operation in a digital domain, can achieve a higher operation parallelism degree with lower power consumption. On the other hand, fault tolerance of a machine learning algorithm may cancel some computing errors of the analog circuit. Therefore, requirements of the convolutional neural network algorithm on real-time quality and for low energy consumption in an actual application can be satisfied by executing the convolutional neural network algorithm in the analog domain.

The image processing apparatus provided in the embodiments of this application is described in detail below with reference to FIG. 3 to FIG. 9.

Figure 3:
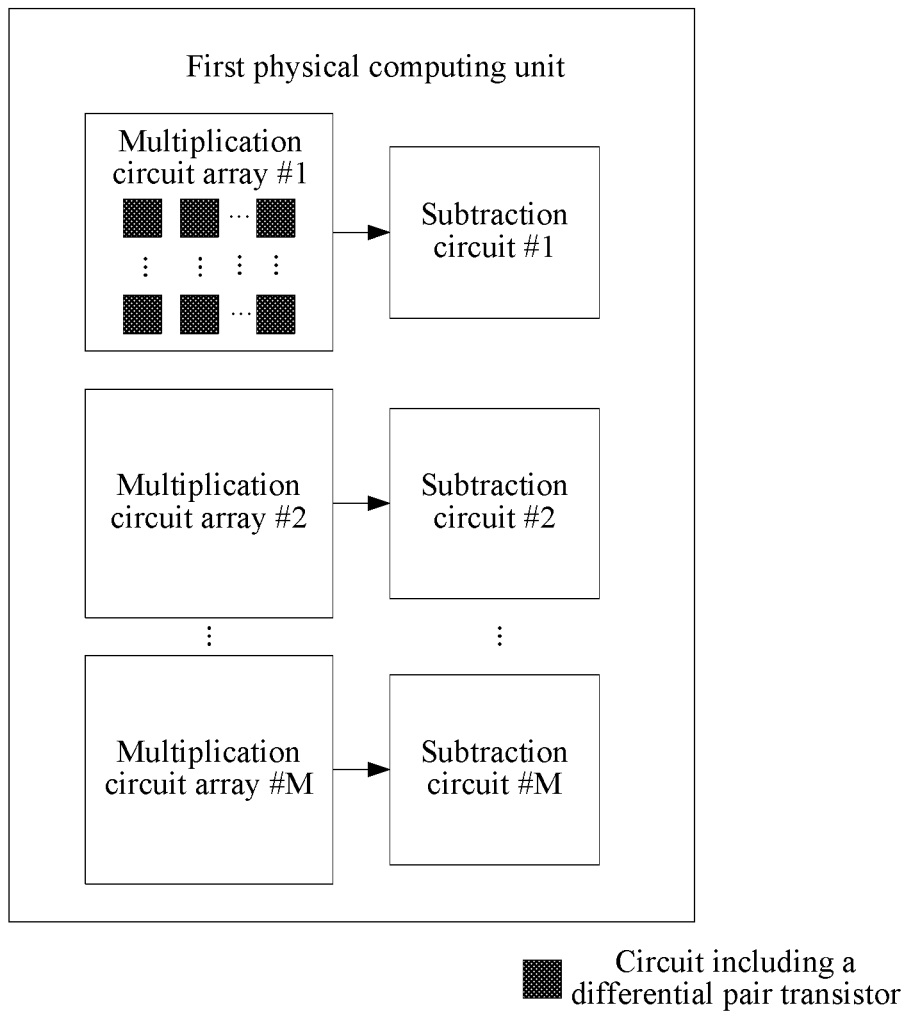
FIG. 3 is a schematic block diagram of a first physical computing circuit according to an embodiment of this application.

FIG. 3 is a schematic block diagram of a first physical computing circuit according to an embodiment of this application. Referring to FIG. 3, the first physical computing circuit includes at least one multiplication circuit array and at least one subtraction circuit, the at least one multiplication circuit array is in a one-to-one correspondence with the at least one subtraction circuit, each multiplication circuit array includes a plurality of multiplication circuits, each multiplication circuit includes a differential pair transistor, each multiplication circuit array implements a convolution operation on a plurality of first analog signals using the plurality of multiplication circuits and a corresponding subtraction circuit, a differential input voltage of a plurality of differential pair transistors included in each multiplication circuit array is used as a convolution kernel used by the multiplication circuit array to perform the convolution operation, and each of the at least one multiplication circuit array has a different convolution kernel.

Actually, the first physical computing circuit is an analog circuit implementing the convolution operation, and therefore may also be referred to as a convolution unit.

Optionally, in an embodiment, the subtraction circuit includes two input interfaces and one output interface, a drain of a first MOS transistor included in each differential pair transistor is used as a first output interface of the corresponding multiplication circuit, a drain of a second MOS transistor included in each differential pair transistor is used as a second output interface of the corresponding multiplication circuit, first output interfaces of all multiplication units in the multiplication circuit array are connected to one input interface of the subtraction circuit, and second output interfaces of all the multiplication circuits in the multiplication circuit array are connected to the other input interface of the subtraction circuit.

The subtraction circuit includes two P-channel current mirrors PMIRs and one N-channel current mirror NMIR, one input interface of the subtraction circuit is connected to the output interface of the subtraction circuit through one of the two PMIRs, and the other input interface of the subtraction circuit is connected to the output interface of the subtraction circuit through the other one of the two PMIRs and the NMIR.

It should be understood that the MOS transistor in this specification is a MOS transistor. The PMIR is a P-channel current mirror (Mirror), and the NMIR is an N-channel current mirror.

Figure 4:
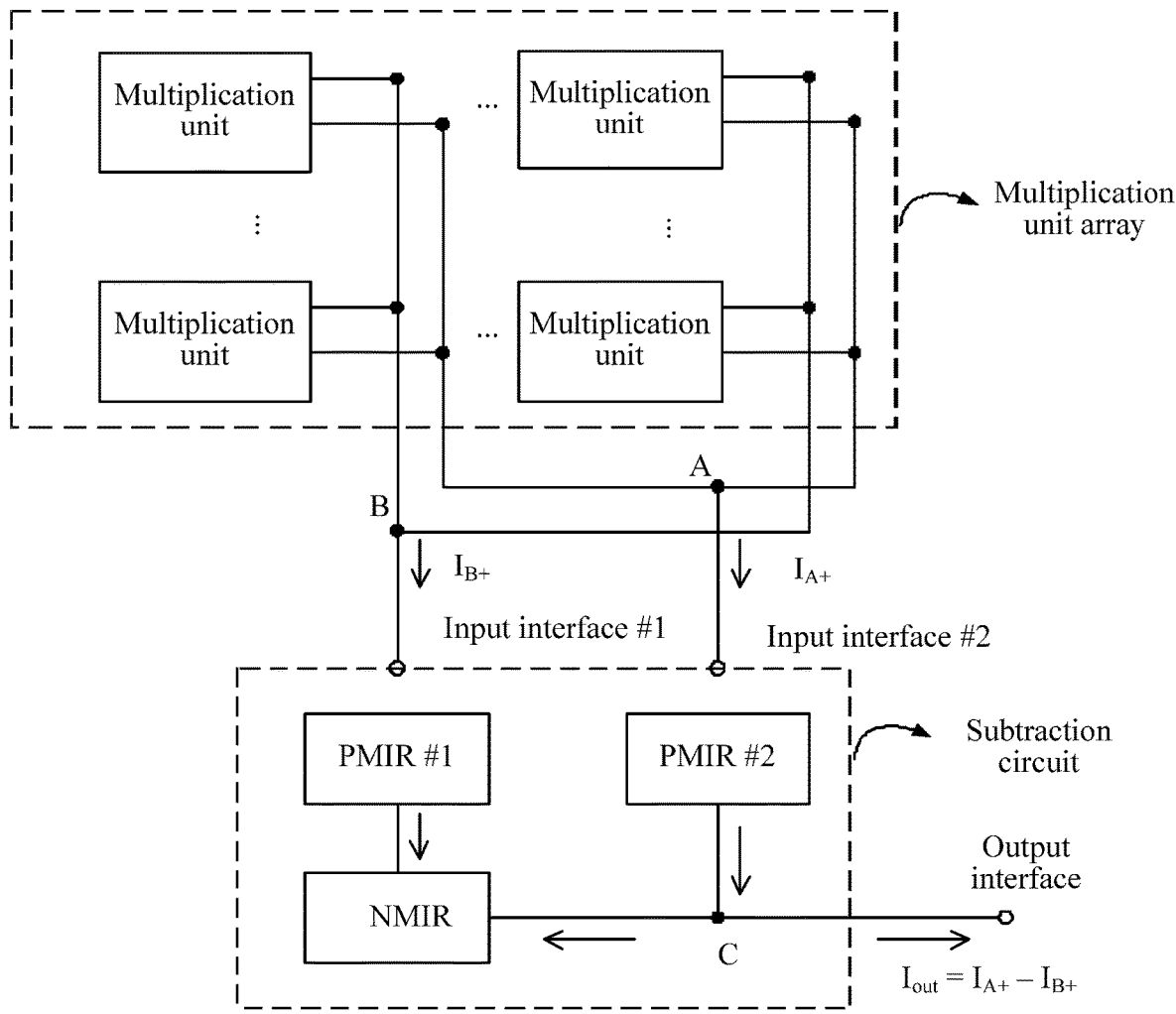
FIG. 4 is a schematic diagram of a connection relationship between a multiplication circuit array and a subtraction circuit according to an embodiment of this application.

FIG. 4 is a schematic diagram of a connection relationship between a multiplication circuit array and a subtraction circuit according to an embodiment of this application. Referring to FIG. 4, each multiplication circuit includes two output interfaces (to be specific, a first output interface and a second output interface). First output interfaces of all multiplication circuits are connected to a node B, and all second output interfaces are connected to a node A. The subtraction circuit includes two input interfaces (for example, an input interface #1 and an input interface #2 that are shown in FIG. 4) and one output interface. The node B is connected to the input interface #1, and the node A is connected to the input interface #2.

In this embodiment of this application, the first physical computing circuit includes at least one multiplication circuit array and at least one subtraction circuit, and can implement a convolution operation on an analog signal. A specific implementation process is described in detail below.

Optionally, in an embodiment, the apparatus further includes a second physical computing circuit, configured to perform a pooling operation on a second analog signal to obtain a third analog signal, where the second physical computing circuit includes a current mirror circuit.

An input interface of the second physical computing circuit is connected to an output interface of the first physical unit, and is configured to perform a pooling operation on an analog signal (namely, the second analog signal) obtained after the convolution operation.

In an embodiment, the second physical computing circuit may implement an average pooling operation using the current mirror circuit.

Optionally, in an embodiment, the apparatus further includes a third physical computing circuit, where an input interface of the third physical computing circuit is connected to an output interface of the first physical computing circuit, to perform non-linear mapping processing on the second analog signal to obtain a fourth analog signal, and a fourth physical computing circuit, where an input interface of the fourth physical computing circuit is connected to an output interface of the third physical computing circuit, to perform an average pooling operation on the fourth analog signal, where the fourth physical computing circuit includes a current mirror circuit.

The third physical computing circuit includes a circuit including a third MOS transistor and a fourth MOS transistor, and the third MOS transistor and the fourth MOS transistor work in a subthreshold region.

It should be noted that, that the output interface of the first physical computing circuit is connected to the input interface of the second physical computing circuit above means that the pooling operation is directly performed after the convolution operation is performed on the analog signal.

In a possible implementation, that an input interface of the third physical computing circuit is connected to an output interface of the first physical computing circuit means that the non-linear mapping processing is performed after the convolution operation is performed on the analog signal. Subsequently, the pooling operation is performed, using the fourth physical computing circuit, on the analog signal on which the non-linear mapping processing has been performed.

It may be understood that in a convolutional neural network, the non-linear mapping may be performed after the convolution operation or the pooling operation, or may not be performed. Correspondingly, in this embodiment of this application, if the pooling operation is directly performed after the convolution operation is performed on the analog signal, the second physical computing circuit may be connected following the first physical computing circuit. If the non-linear mapping needs to performed after the analog signal is convolved, the third physical computing circuit and the fourth physical computing circuit may be sequentially connected following the first physical computing circuit, to perform the non-linear mapping processing and the pooling operation on the convolved analog signal.

It should be understood that sequence numbers such as "first" and "second" in this embodiment of this application are merely used to distinguish between different objects, for example, to distinguish between different physical computing circuits. No limitation should be imposed on the protection scope of this embodiment of this application.

Therefore, both the second physical computing circuit and the fourth physical computing circuit herein are actually analog circuits configured to perform the pooling operation on the analog signal, and may be the same or may be different. This is not limited in this embodiment of this application.

Optionally, in an embodiment, the apparatus further includes a fifth physical computing circuit, where an input interface of the fifth physical computing circuit is connected to an output interface of the second physical computing circuit, to perform non-linear mapping processing on the third analog signal.

The fifth physical computing circuit includes a circuit including a fifth MOS transistor and a sixth MOS transistor, and the fifth MOS transistor and the sixth MOS transistor work in the subthreshold region.

Similar to the foregoing descriptions, the fifth physical computing circuit herein is configured to perform the non-linear mapping processing after the pooling operation is performed on the analog signal. Therefore, the fifth physical computing circuit may have a same circuit composition as or a different circuit composition from that of the third physical computing circuit.

A process of implementing a convolutional neural network algorithm by an image processing apparatus 100 provided in an embodiment of this application is described below.

Figure 5:
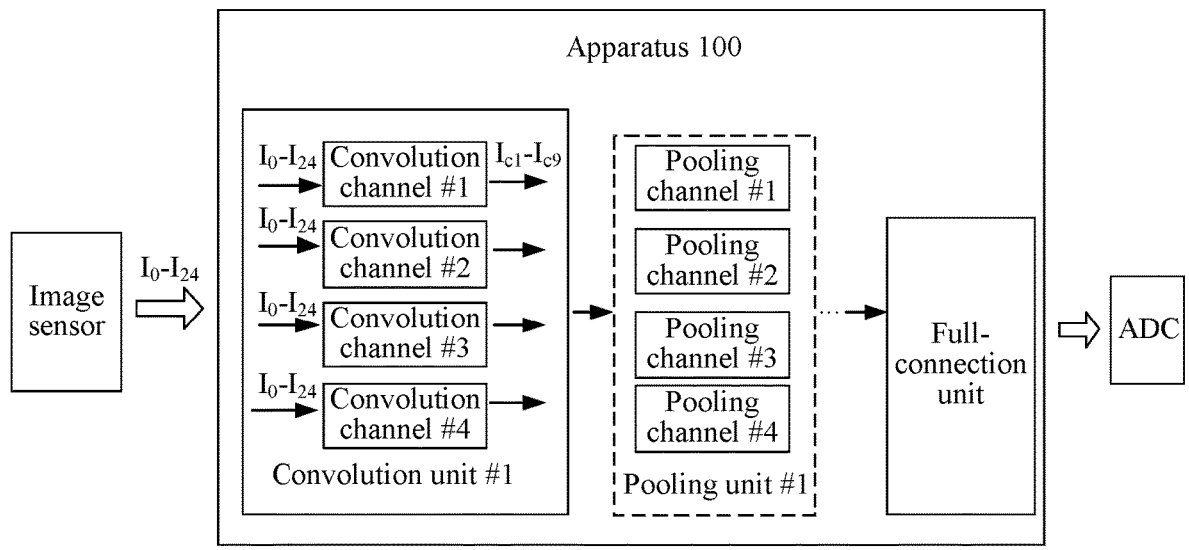
FIG. 5 is a schematic architectural diagram of an image processing apparatus 100 according to an embodiment of this application.

FIG. 5 is a schematic architectural diagram of an image processing apparatus according to an embodiment of this application. Referring to FIG. 5, an image sensor first obtains pixel data of a to-be-recognized image, converts the obtained pixel data into an analog signal, and inputs the analog signal into an analog computing circuit (namely, a physical computing circuit). Starting from the analog computing circuit, the pixel data of the to-be-recognized image is converted to an analog domain for operations such as convolution and pooling.

For ease of description, an example in which the image sensor converts the pixel data into an analog current signal for outputting is used below.

Figure 6:
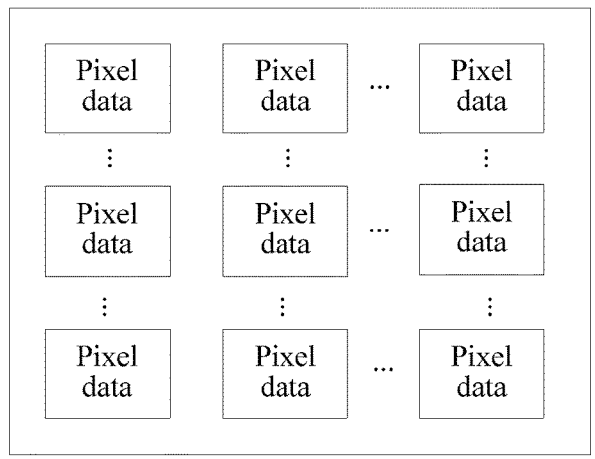
FIG. 6 is a schematic diagram of a matrix including pixel data of a to-be-recognized image.

It may be understood that the image sensor obtains more than one piece of pixel data of the to-be-recognized image. Therefore, there are also a plurality of analog current signals obtained through conversion, and the plurality of current signals are in a one-to-one correspondence with these pieces of pixel data. To be specific, each current signal corresponds to one piece of pixel data. For a matrix including the pixel data herein, refer to FIG. 6. FIG. 6 is a schematic diagram of a matrix including pixel data of a to-be-recognized image. It should be understood that the matrix including the pixel data corresponds to the input matrix of the convolution operation that is shown in FIG. 2, but these pieces of pixel data are converted into a form of analog current signals and enter physical computing circuits provided in this embodiment of this application, so that these physical computing circuits perform, on these analog current signals, operation (for example, convolution and pooling) processing corresponding to layers of a convolutional neural network.

It is assumed herein that a size of the matrix that includes the pixel data and that is used as the input matrix of the convolution operation is 5×5. In this way, 5×5 pieces of pixel data are correspondingly converted into 5×5 analog current signals through processing of the image sensor. The 5×5 analog current signals are sequentially denoted as $I_0$ to $I_{24}$ in this specification. A processing procedure of the analog currents $I_0$ to $I_{24}$ in the physical computing circuits is described in detail below. When the size of the input matrix changes, processing procedures in the analog domain are similar.

The currents $I_0$ to $I_{24}$ are first replicated and enter a physical computing circuit (denoted as a convolution unit #1 below) corresponding to a first convolution layer of the convolutional neural network. It should be understood that the convolution unit #1 shown in FIG. 5 is the first physical computing circuit described in the embodiments of this application.

In this embodiment of this application, the currents $I_0$ to $I_{24}$ are replicated using a current mirror.

It should be understood that the current mirror is a mirror current source. When a reference current is input from an input end of a current mirror, an output current whose size and direction are both consistent with those of the reference current is output from an output end of the current mirror. To be specific, the output current is a complete replication of the reference current.

A specific implementation form of the current mirror is not limited in this embodiment of this application, provided that complete replications of the currents $I_0$ to $I_{24}$ can be implemented.

In this embodiment of this application, the convolution unit #1 includes a plurality of different convolution channels, and each convolution channel corresponds to one convolution template. Actually, each convolution template herein corresponds to a convolution kernel used during a convolution operation. One convolution kernel is implemented using one multiplication circuit array described above.

It should be understood that four convolution channels are used as an example rather than a limitation in FIG. 5. A quantity of convolution channels that should be included in one convolution unit is related to a quantity of to-be-extracted features of the to-be-recognized image. It may be learned according to a principle used when the convolutional neural network recognizes an image that, each convolution kernel is used to extract one feature of the image. In addition, convolution operations in different locations on a same convolution layer share one weight.

That the analog currents $I_0$ to $I_{24}$ enter the convolution unit #1 is actually that the analog currents $I_0$ to $I_{24}$ enter the convolution channels.

It may be learned based on the foregoing convolution operation process that the convolution operation is an operation process between elements of both the input matrix and the convolution kernel. In this embodiment of this application, an input matrix on which a convolution operation is performed is a matrix including the analog current signals converted from the pixel data of the to-be-recognized image, and a convolution kernel is the convolution template corresponding to the convolution channel.

Therefore, the currents $I_0$ to $I_{24}$ corresponding to the pixel data that are in the input matrix enter each convolution channel in the convolution unit after being sequentially replicated, and the convolution template corresponding to each convolution channel performs the convolution operation on these current signals.

A structure of an analog circuit performing a convolution operation in each convolution channel is described below using one convolution template as an example.

Figure 7:
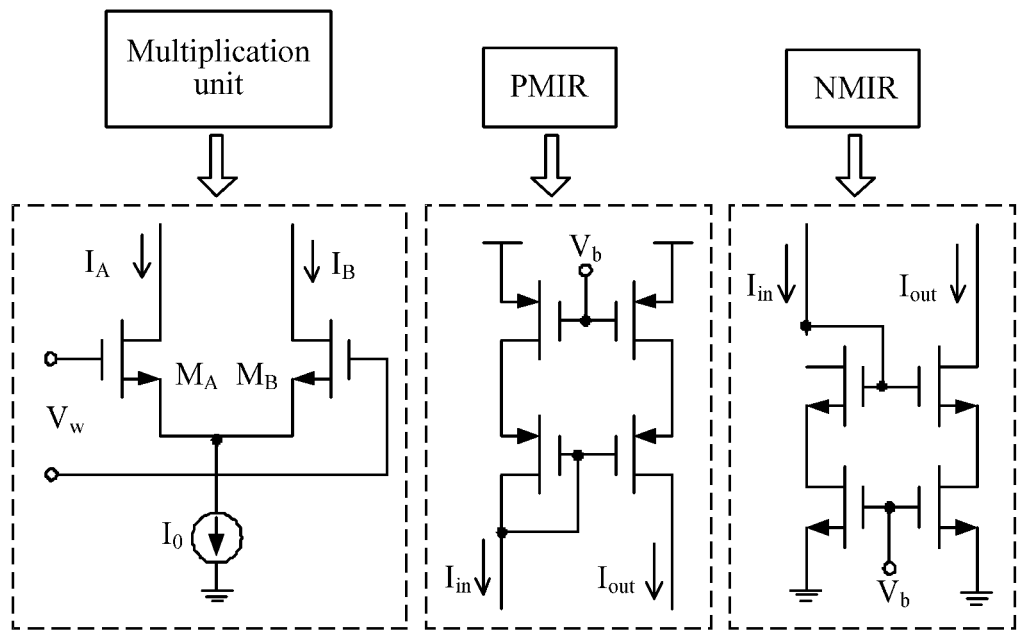
FIG. 7 is a schematic structural diagram of a multiplication circuit and a current mirror circuit according to an embodiment of this application.

FIG. 7 is a schematic structural diagram of a multiplication circuit and a current mirror circuit according to an embodiment of this application. As shown in FIG. 7, a multiplication circuit includes a circuit including a differential pair transistor. The differential pair transistor includes two MOS transistors (respectively denoted as a MOS transistor # A and a MOS transistor # B below and briefly denoted as $M_A$ and $M_B$).

A differential input voltage between gates of $M_A$ and $M_B$ is denoted as $V_\omega$, and currents of drains of $M_A$ and $M_B$ are respectively denoted as $I_A$ and $I_B$. Sources of $M_A$ and $M_B$ are connected to each other and grounded. It should be noted that in this embodiment of this application, grounding currents of the sources of the differential pair transistor $M_A$ and $M_B$ herein are the analog currents $I_0$ to $I_{24}$.

It may be understood that, each multiplication circuit corresponds to one analog current, to perform a multiplication operation on the analog current and a differential input voltage of a differential pair transistor of the multiplication circuit.

Using the current $I_0$ as an example, $I_A$ and $I_B$ may be respectively calculated based on a formula (1) and a formula (2):

$$I_A = I_0 \times \frac{1}{1 + \exp\left(\frac{-V_\omega}{nV_T}\right)}, \text{ and} \quad (1)$$

$$I_B = I_0 \times \frac{1}{1 + \exp\left(\frac{V_\omega}{nV_T}\right)}. \quad (2)$$

A parameter $V_T$ in the formulas is a turn-on voltage of the MOS transistor.

It may be understood that when the differential input voltage $V_\omega$ between the gates of $M_A$ and $M_B$ is quite small, a difference between the currents of the drains of $M_A$ and $M_B$ may be expressed by a formula (3):

$$I_{diff} = I_A - I_B \approx \frac{1}{2nV_T} \cdot I_0 \cdot V_\omega. \quad (3)$$

In this embodiment of this application, the differential input voltage $V_\omega$ between the gates of $M_A$ and $M_B$ is controlled, so that a differential input voltage of a differential pair transistor forming each multiplication circuit in a multiplication circuit array may be set, to construct different convolution kernels. In other words, each convolution channel corresponds to one convolution template, each convolution template actually includes one multiplication circuit array, and each multiplication circuit array corresponds to a convolution kernel of the convolution template. The convolution kernel includes a matrix. Each element in the matrix is the differential input voltage of the differential pair transistor forming each multiplication circuit in the multiplication circuit array. For ease of description, it is assumed below that a size of the convolution kernel is 3×3, to be specific, the multiplication unit array is a 3×3 array.

Therefore, when the analog currents $I_0$ to $I_{24}$ corresponding to the pixel data of the to-be-recognized image are replicated to enter each convolution template, a multiplication operation is implemented on each analog current using multiplication circuits in the multiplication circuit array corresponding to the convolution template.

It may be learned based on the convolution operation process that each convolution channel outputs 3×3 analog currents, and the 3×3 analog currents are elements in an output matrix (which should be 3×3) obtained by the convolution channel by performing a convolution operation.

In this embodiment of this application, the drain of $M_A$ and the drain of $M_B$ are respectively used as two output interfaces of the multiplication circuit. The drain of $M_A$ is denoted as a first output interface of each multiplication circuit, and the drain of $M_B$ is denoted as a second output interface of each multiplication circuit. It may be learned with reference to FIG. 4 above that the first output interface of each multiplication circuit is connected to a same node (for example, the node A in FIG. 4) in the circuit, to accumulate output currents $I_A$ of first output interfaces of a plurality of multiplication circuits, the second output interface of each multiplication circuit is connected to a same node (for example, the node B in FIG. 4) in the circuit, to accumulate output currents $I_B$ of second output interfaces of the plurality of multiplication circuits.

In addition, a convolution operation unit implements, using a subtraction circuit, a subtraction operation on a current (denoted as $I_{A+}$) that is output from the node A and a current (denoted as $I_{B+}$) that is output from the node B. In an embodiment, a specific structure form of the subtraction circuit implementing the subtraction between the current $I_{A+}$ and the current $I_{B+}$ is not limited in this embodiment of this application. It should be understood that the subtraction circuit shown in FIG. 4 is merely an example. A person skilled in the art may alternatively design, through simple replacement, another circuit structure having a same function.

Similarly, for circuit structures of the PMIR and the NMIR, refer to FIG. 7.

It should be understood that the current $I_{A+}$ is a sum of currents $I_A$ of first output interfaces of all multiplication circuits in one multiplication circuit array, and the current $I_{B+}$ is a sum of currents $I_B$ of second output interfaces of all multiplication circuits in the multiplication circuit array.

With reference to FIG. 4 above, the node A and the node B are respectively connected to a P-channel current mirror PMIR. A PMIR #1 is connected to the node B to replicate the current $I_{B+}$. A PMIR #2 is connected to the node A to replicate the current $I_{A+}$. In addition, the PMIR #1 is connected to an N-channel current mirror NMIR. In this way, after the current $I_{B+}$ passes through the PMIR #1 and the NMIR, a reference direction of the current $I_{B+}$ changes, so that the current $I_{B+}$ is subtracted, at a node C, from the current $I_{A+}$ passing through the node A. An output current $I_{out}$ is equal to $I_{A+}-I_{B+}$.

A result of the convolution operation performed on the current signals converted from the pixel data of the to-be-recognized image by the convolution unit #1 is obtained hereto.

A person skilled in the art may obtain convolution templates of different sizes by changing a size and an organization form of the multiplication circuit array provided in this embodiment of this application, to construct convolution units in different dimensions.

It should be noted that specific circuit forms of the N-channel current mirror NMIR and the P-channel current mirror PMIR may be shown in FIG. 7. Apparently, a structure of a current mirror shown in FIG. 7 is merely described as an example.

Still referring to FIG. 5, a convolution channel #1 to a convolution channel #4 each output 3×3 analog current signals.

Using the convolution channel #1 as an example below, subsequent processing of analog current signals output by the convolution channel #1 is described. For ease of description, 3×3 analog current signals output by the convolution channel #1 are denoted as $I_{C1}$ to $I_{C9}$.

It is assumed that a physical computing circuit connected to the convolution unit #1 is a pooling unit #1. Each convolution channel corresponds to one pooling channel. The analog currents output by the convolution channel #1 to the convolution channel #4 are respectively sent into a corresponding pooling channel #1 to a corresponding pooling channel #4 in the pooling unit #1. Each pooling channel performs, through average pooling, pooling processing on analog currents entering the pooling channel.

Figure 8:
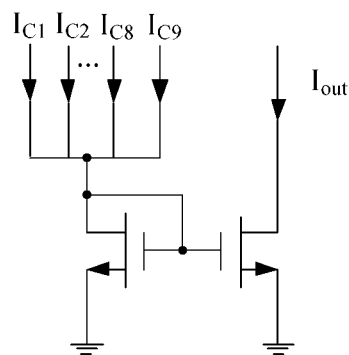
FIG. 8 is a schematic structural diagram of a circuit used for a pooling operation according to an embodiment of this application.

FIG. 8 is a schematic structural diagram of a circuit used for a pooling operation according to an embodiment of this application. In an embodiment, in this embodiment of this application, average pooling is implemented using a current mirror circuit. Using the pooling unit #1 as an example, an analog current that is output by the pooling unit #1 is:

$$I_{out} = \sum_{i=1}^{i=n} I_i / n. \tag{4}$$

It should be understood that, n herein is a size of a pooling window of the pooling channel. For example, when the size of the pooling window is 3×3, n is 9. In the foregoing example, there are nine analog currents output by the convolution channel #1 that have sizes of $I_{C1}$ to $I_{C9}$. Therefore, if the size of the pooling window is 3×3, after the pooling channel #1 performs an average pooling operation on the currents $I_{C1}$ to $I_{C9}$, an output current $I_{out}$ is equal to $(I_{C1}+I_{C2}+ \ldots +I_{C8}+I_{C9})/9$.

A pooling operation in another pooling channel is similar, and details are not described herein again.

A first-time pooling operation is complete hereto.

Non-linear mapping processing is correspondingly performed, after the convolution layer or the pooling layer, on a signal that is output by the convolution layer or the pooling layer.

It should be understood that the pooling unit may correspond to a physical computing circuit configured to perform a pooling operation in this embodiment of this application. For example, the physical computing circuit is the second physical computing circuit.

Optionally, in an embodiment, this embodiment of this application provides a non-linear mapping unit. The non-linear mapping unit may be connected after the convolution unit, to perform non-linear mapping processing on an analog current that is output by the convolution unit, and/or, the non-linear mapping unit is connected after the pooling unit, to perform non-linear mapping processing on an analog current that is output by the pooling unit.

Figure 9:
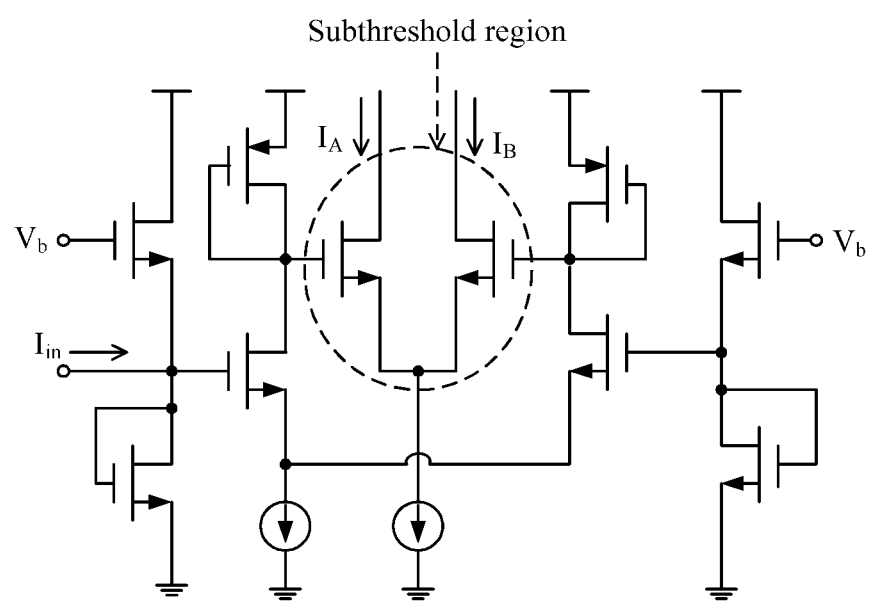
FIG. 9 is a schematic structural diagram of a circuit used for non-linear mapping processing according to an embodiment of this application.

FIG. 9 is a schematic structural diagram of a circuit used for non-linear mapping processing according to an embodiment of this application. A non-linear mapping function used in this embodiment of this application is a Sigmoid function. A circuit structure implementing a function of the Sigmoid function is shown as a structure in a dashed-line circle in FIG. 9. Two transistors $M_{S1}$ and $M_{S2}$ form a differential pair transistor. In addition, when in a working state, $M_{S1}$ and $M_{S2}$ both work in a subthreshold region, and output currents in a form of the Sigmoid function. A peripheral circuit outside the dashed-line circle in FIG. 9 is an interface circuit to implement signal mode conversion, to directly receive a previous-level output.

For a related description that the MOS transistor works in the subthreshold region herein, details are not described herein.

It should be understood that both the third physical computing circuit and the fifth physical computing circuit that are described above are configured to perform a non-linear mapping operation on an analog signal. Therefore, the third physical computing circuit and the fifth physical computing circuit may be implemented using the circuit structure shown in FIG. 9.

According to the physical units (namely, the analog circuits) provided in this embodiment of this application, the convolutional neural network algorithm can be accelerated while being implemented. Subsequently, the analog signal that is output from the apparatus 100 may be sampled and converted into a digital domain using an analog to digital converter (ADC) to obtain a recognition result (in other words, a classification result) of the to-be-recognized image.

It should be noted that, a neural network parameter required when the apparatus 100 provided in this embodiment of this application performs signal processing in the analog domain may be provided using a fixed bias or through conversion performed by the analog to digital converter (DAC). Alternatively, the neural network parameter may be provided using a non-volatile analog storage means, for example, a floating gate.

According to each physical computing circuit provided in this embodiment of this application, using an analog circuit that includes one convolution layer, one pooling layer, and one full-connection layer and that has one feature graph as an example, in a High Simulation Program with Integrated Circuit Emphasis (HSPICE) simulation environment, a classification test is performed on a 28×28 MNIST dataset picture using pre-trained parameters. When a circuit used in simulation is designed through an SMIC 0.18-μm process, a test result indicates that an establishment time of the circuit is approximately 50 ns. When a classification result is sampled at a time every 100 ns ($\frac{1}{10}$ M), average energy consumption for sampling a picture in this embodiment of this application is 1.47 nJ, and energy efficiency may reach 22 T operands per second and per watt. Compared with an Intel dual-core CPU, the energy efficiency is increased for four order-of-magnitudes. In terms of precision, compared with a CPU, classification precision is decreased only by 0.73%. Analog-to-digital conversion bandwidth is reduced to 1.3% of original bandwidth.

According to the image processing apparatus provided in the embodiments of this application, related processing such as the convolution operation and the pooling operation of the image in the analog domain may be implemented using the physical computing circuits organized based on a structure of the convolutional neural network, so that requirements of the convolutional neural network on real-time quality and low power consumption are satisfied while the convolutional neural network algorithm is accelerated.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

It may be clearly understood by a person skilled in the art that, for ease of convenience and brevity, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division or may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electrical, mechanical, or other forms.

The units described as separate parts may or may not be physically separate, and parts displayed as units may or may not be physical units, and may be located in one position or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes any medium that can store program code, such as a USB flash drive, a removable hard disk, a read-only memory (ROM), a random access memory (RAM), a magnetic disk, or a compact disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An image processing apparatus, comprising:
a first physical computing circuit comprising:
a receiver configured to receive a plurality of first analog signals output by an image sensor, wherein the plurality of first analog signals are in a one-to-one correspondence with a plurality of pieces of pixel data of a to-be-recognized image; and
at least one multiplication circuit array comprising:
a plurality of subtraction circuits; and
a plurality of multiplication circuits in a one-to-one correspondence with at least one subtraction circuit, wherein each multiplication circuit comprises a differential pair transistor and is configured to perform a convolution operation on the plurality of first analog signals to obtain a second analog signal using a convolution kernel, wherein the convolution kernel is based on a differential input voltage of a plurality of differential pair transistors comprised in each of the at least one multiplication circuit array, wherein each of the at least one multiplication circuit array has a different convolution kernel, and wherein the second analog signal indicates a recognition result of the to-be-recognized image.

2. The image processing apparatus according to claim 1, wherein each differential pair transistor comprises a first metal-oxide-semiconductor (MOS) transistor and a second MOS transistor, and wherein the first MOS transistor and the second MOS transistor work in a subthreshold region.

3. The image processing apparatus according to claim 2, wherein the at least one subtraction circuit comprises two input interfaces, one output interface, two P-channel current mirrors (PMIRs), and one N-channel current mirror (NMIR), wherein a drain of the first MOS transistor comprised in each differential pair transistor is a first output interface of a corresponding multiplication circuit, wherein a drain of the second MOS transistor comprised in each differential pair transistor is a second output interface of the corresponding multiplication circuit, wherein first output interfaces of all the multiplication circuits in the at least one multiplication circuit array are connected to one input interface of the at least one subtraction circuit, and second output interfaces of all the multiplication circuits in the multiplication circuit array are connected to another input interface of the at least one subtraction circuit, wherein one input interface of the at least one subtraction circuit is connected to the output interface of the at least one subtraction circuit through one of the two PMIRs, and wherein the other input interface of the at least one subtraction circuit is connected to the output interface of the at least one subtraction circuit through another one of the two PMIRs and the NMIR.

4. The image processing apparatus according to claim 1, further comprising a second physical computing circuit configured to perform a pooling operation on the second analog signal to obtain a third analog signal, wherein the second physical computing circuit comprises a current mirror circuit.

5. The image processing apparatus according to claim 4, wherein there are a plurality of second analog signals, wherein the second physical computing circuit comprises at least one current mirror circuit, wherein the at least one current mirror circuit is in a one-to-one correspondence with the at least one multiplication circuit array, and wherein each current mirror circuit is configured to perform the pooling operation on the second analog signal that is output by a corresponding multiplication circuit array.

6. The image processing apparatus according to claim 4, further comprising a fifth physical computing circuit, wherein an input interface of the fifth physical computing circuit is connected to an output interface of the second physical computing circuit to perform non-linear mapping processing on the third analog signal.

7. The image processing apparatus according to claim 6, wherein the fifth physical computing circuit comprises a fifth MOS transistor and a sixth MOS transistor, and wherein the fifth MOS transistor and the sixth MOS transistor work in a subthreshold region.

8. The image processing apparatus according to claim 4, wherein the pooling operation is an average pooling operation.

9. The image processing apparatus according to claim 1, further comprising:
a third physical computing circuit, wherein an input interface of the third physical computing circuit is connected to an output interface of the first physical computing circuit to perform non-linear mapping processing on the second analog signal to obtain a fourth analog signal; and
a fourth physical computing circuit, wherein an input interface of the fourth physical computing circuit is connected to an output interface of the third physical computing circuit to perform a pooling operation on the fourth analog signal, and wherein the fourth physical computing circuit comprises a current mirror circuit.

10. The image processing apparatus according to claim 9, wherein the third physical computing circuit comprises a circuit comprising a third metal-oxide-semiconductor (MOS) transistor and a fourth MOS transistor, and wherein the third MOS transistor and the fourth MOS transistor work in a subthreshold region.

11. A first physical computer, comprising:
a receiver configured to receive a plurality of first analog signals output by an image sensor, wherein the plurality of first analog signals are in a one-to-one correspondence with a plurality of pieces of pixel data of a to-be-recognized image; and
at least one multiplication circuit array comprising:
at least one subtraction circuit; and
a plurality of multiplication circuits in a one-to-one correspondence with the at least one subtraction circuit, wherein each multiplication circuit comprises a differential pair transistor and is configured to perform a convolution operation on the plurality of first analog signals to obtain a second analog signal using a convolution kernel, wherein the convolution kernel is based on a differential input voltage of a plurality of differential pair transistors comprised in each of the at least one multiplication circuit array, wherein each of the at least one multiplication circuit array has a different convolution kernel, and wherein the second analog signal indicates a recognition result of the to-be-recognized image.

12. The first physical computer according to claim 11, wherein each differential pair transistor comprises a first metal-oxide semiconductor (MOS) transistor and a second MOS transistor, and wherein the first MOS transistor and the second MOS transistor work in a subthreshold region.

13. The first physical computer according to claim 12, wherein the at least one subtraction circuit comprises two input interfaces, one output interface, two P-channel current mirrors (PMIRs), and one N-channel current mirror (NMIR), wherein a drain of the first MOS transistor comprised in each differential pair transistor is used as a first output interface of a corresponding multiplication circuit, wherein a drain of the second MOS transistor comprised in each differential pair transistor is used as a second output interface of the corresponding multiplication circuit, wherein first output interfaces of all the multiplication circuits in the at least one multiplication circuit array are connected to one input interface of the at least one subtraction circuit, and second output interfaces of all the multiplication circuits in the multiplication circuit array are connected to another input interface of the at least one subtraction circuit, wherein one input interface of the at least one subtraction circuit is connected to the output interface of the at least one subtraction circuit through one of the two PMIRs, and wherein the other input interface of the at least one subtraction circuit is connected to the output interface of the at least one subtraction circuit through another one of the two PMIRs and the NMIR.

14. The first physical computer according to claim 11, wherein the first physical computer is coupled to a second physical computer configured to perform a pooling operation on the second analog signal to obtain a third analog signal, and wherein the second physical computer comprises a current mirror circuit.

15. The first physical computer according to claim 14, further comprising:
a third physical computer, wherein an input interface of the third physical computer is connected to an output interface of the first physical computer to perform non-linear mapping processing on the second analog signal to obtain a fourth analog signal; and
a fourth physical computer, wherein an input interface of the fourth physical computer is connected to an output interface of the third physical computer to perform a pooling operation on the fourth analog signal, and wherein the fourth physical computer comprises a current mirror circuit.

16. The image processing apparatus according to claim 1, wherein each differential pair transistor comprises a first metal-oxide-semiconductor (MOS) transistor and a second MOS transistor.

17. The image processing apparatus according to claim 1, further comprising a second physical computing circuit configured to perform a pooling operation on the second analog signal to obtain a third analog signal.

18. The first physical computer according to claim 11, wherein each differential pair transistor comprises a first metal-oxide semiconductor (MOS) transistor and a second MOS transistor.

19. The first physical computer according to claim 11, wherein the first physical computer is coupled to a second physical computer configured to perform a pooling operation on the second analog signal to obtain a third analog signal.

20. The first physical computer according to claim 11, wherein the at least one subtraction circuit comprises two input interfaces, one output interface, two P-channel current mirrors (PMIRs), and one N-channel current mirror (NMIR).

* * * * *